US008294648B2

(12) United States Patent
Kwon

(10) Patent No.: US 8,294,648 B2
(45) Date of Patent: *Oct. 23, 2012

(54) GRAY-SCALE CURRENT GENERATING CIRCUIT, DISPLAY DEVICE USING THE SAME, AND DISPLAY PANEL AND DRIVING METHOD THEREOF

(75) Inventor: Oh-Kyong Kwon, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1105 days.

This patent is subject to a terminal disclaimer.

(21) Appl. No.: 11/228,706

(22) Filed: Sep. 16, 2005

(65) Prior Publication Data

US 2006/0077140 A1 Apr. 13, 2006

(30) Foreign Application Priority Data

Oct. 8, 2004 (KR) ........................ 10-2004-0080384
Oct. 8, 2004 (KR) ........................ 10-2004-0080388

(51) Int. Cl.

| | |
|---|---|
| ***G09G 3/30*** | (2006.01) |
| ***G09G 3/36*** | (2006.01) |
| ***G09G 5/00*** | (2006.01) |
| ***G09G 3/10*** | (2006.01) |
| ***G06F 3/038*** | (2006.01) |
| ***G11C 27/02*** | (2006.01) |
| ***H03L 5/00*** | (2006.01) |

(52) U.S. Cl. .............. 345/89; 345/76; 345/82; 345/100; 345/204; 327/91; 327/333; 315/169

(58) Field of Classification Search .................. 345/607, 345/204, 77, 76, 82–83, 99, 100, 690; 327/91–94, 327/333; 315/169
See application file for complete search history.

(56) References Cited

U.S. PATENT DOCUMENTS 7,466,166 B2 * 12/2008 Date et al. .................... 327/108
(Continued)

FOREIGN PATENT DOCUMENTS

KR 2002-0046756 6/2002
(Continued)

OTHER PUBLICATIONS

Korean Patent Abstracts, Publication No. 1020020046756 A; Date of Publication: Jun. 21, 2002; in the name of Seong Jun Bae et al.

(Continued)

*Primary Examiner* — Bipin Shalwala
*Assistant Examiner* — Matthew Fry
(74) *Attorney, Agent, or Firm* — Christie, Parker & Hale, LLP

(57) ABSTRACT

A grayscale current generating circuit and an organic light emitting diode (OLED) display using the same, and a display panel and a driving method thereof. An exemplary display device according to an embodiment of the present invention includes a display unit having a plurality of data lines for transmitting a data current, a plurality of scan lines for transmitting a selection signal, and a plurality of pixel areas defined by the data lines and the scan lines. The display device includes a data driver for transforming a plurality of grayscale data into the data current and applying the data current to the data lines. In addition, the display device may include a scan driver for sequentially applying the selection signal to the plurality of scan lines. The data driver includes a first current generator for generating a plurality of first currents and a plurality of digital/analog (D/A) converters. The D/A converters include a plurality of current sample/hold circuits for respectively sampling/holding the first currents and outputting a plurality of second currents corresponding to the sampled/held first currents in response to at least one of the plurality of grayscale data.

17 Claims, 8 Drawing Sheets

U.S. PATENT DOCUMENTS

| | | | | |
|---|---|---|---|---|
| 7,570,244 | B2 * | 8/2009 | Agari et al. | 345/100 |
| 2003/0048669 | A1 * | 3/2003 | Abe | 365/189.09 |
| 2003/0128199 | A1 * | 7/2003 | Kimura | 345/204 |
| 2003/0128200 | A1 * | 7/2003 | Yumoto | 345/211 |
| 2004/0239668 | A1 * | 12/2004 | Morosawa et al. | 345/212 |
| 2004/0263241 | A1 * | 12/2004 | Fujikura et al. | 327/543 |
| 2005/0007361 | A1 * | 1/2005 | Fujikura et al. | 345/204 |
| 2005/0024303 | A1 * | 2/2005 | Kimura et al. | 345/82 |
| 2005/0151705 | A1 | 7/2005 | Fish | |
| 2006/0017589 | A1 * | 1/2006 | Jo | 341/13 |
| 2006/0017664 | A1 * | 1/2006 | Takagi et al. | 345/76 |
| 2006/0158396 | A1 * | 7/2006 | Jo | 345/76 |
| 2006/0170629 | A1 * | 8/2006 | Baek | 345/76 |
| 2007/0080905 | A1 * | 4/2007 | Takahara | 345/76 |
| 2007/0132674 | A1 * | 6/2007 | Tsuge | 345/77 |

FOREIGN PATENT DOCUMENTS

| | | |
|---|---|---|
| KR | 10-2004-0042846 | 5/2004 |
| WO | WO 025614 A1 * | 3/2004 |

OTHER PUBLICATIONS

Korean Patent Abstracts, Publication No. 1020040042846 A; Date of Publication: May 20, 2004; in the name of Norio Nakamura.

U.S. Office action dated Sep. 29, 2008, for related U.S. Appl. No. 11/228,754, indicating relevance of listed references in this IDS.

* cited by examiner

GRAY-SCALE CURRENT GENERATING CIRCUIT, DISPLAY DEVICE USING THE SAME, AND DISPLAY PANEL AND DRIVING METHOD THEREOF

CROSS-REFERENCE TO RELATED APPLICATIONS

This application claims priority to and the benefit of Korean Patent Applications Nos. 10-2004-0080384 and 10-2004-0080388 filed in the Korean Intellectual Property Office on the same date of Oct. 8, 2004, the entire contents of which are incorporated herein by reference.

FIELD OF THE INVENTION

The present invention relates to a display device. More particularly, the present invention relates to a grayscale current generating circuit and an organic light emitting diode (herein referred to as OLED) display using the same, and a display panel and a driving method thereof.

BACKGROUND OF THE INVENTION

In general, an OLED display is a display device that electrically excites fluorescent organic material for emitting light and displays an image by voltage programming or current programming N×M organic light emitting cells. An organic light emitting cell of the OLED display includes an anode (which may be made from indium tin oxide, or ITO), an organic thin film, and a cathode layer (which may be metal). The organic thin film has a multi-layer structure including an emitting layer (herein referred to as EML), an electron transport layer (herein referred to as ETL), and a hole transport layer (herein referred to as HTL) so as to balance electrons and holes to thereby enhance light emitting efficiency. Further, the organic thin film separately includes an electron injection layer (herein referred to as EIL) and a hole injection layer (herein referred to as HIL).

Methods of driving the organic light emitting cells having the foregoing configuration include a passive matrix method and an active matrix method employing a thin film transistor (herein referred to as TFT) or a metal-oxide semiconductor field-effect transmitter (herein referred to as MOSFET). In the passive matrix method, an anode and a cathode are formed crossing each other, and a line is selected to drive the organic light emitting cells. In the active matrix method, an indium tin oxide (herein referred to as ITO) pixel electrode is coupled to the TFT, and the light emitting cell is driven by a voltage maintained by capacitance of a capacitor. Herein, the active matrix method can be classified as a voltage programming method or a current programming method depending on the type of signals transmitted to the capacitor to distinctively control the voltage applied to the capacitor.

A pixel circuit according to a conventional voltage programming method has difficulties in expressing high-level gray scales due to deviations of threshold voltages VTHs of TFTs and/or mobilities of carriers of the TFTs, the deviations being generated as a result of a non-uniform manufacturing process of the TFTs. On the other hand, although currents and/or voltages supplied driving transistors in a plurality of pixel circuits may not be uniform, a pixel circuit employing a current programming method can provide panel uniformity as long as a current supplied from a current source to the pixel circuits is uniform.

When utilizing a display device by using the pixel circuit that employs the current programming method, a grayscale current generating circuit is required to convert grayscale data into a grayscale current to apply the grayscale current to the pixel circuit.

The above information disclosed in this Background of the Invention section is only for enhancement of understanding of the background of the invention and therefore, unless explicitly described to the contrary, it should not be taken as an acknowledgment or any form of suggestion that this information forms the prior art that is already known in this country to a person skilled in the art.

SUMMARY OF THE INVENTION

An embodiment of the present invention provides a grayscale current generating circuit and an organic light emitting diode (herein referred to as OLED) display using the same, and a display panel and a driving method thereof for outputting a grayscale current corresponding to a grayscale data.

An exemplary display device according to an embodiment of the present invention includes a display unit, a data driver, and a scan driver. In this embodiment, the display unit includes a plurality of data lines for transmitting a data current, a plurality of scan lines for transmitting a selection signal, and a plurality of pixel areas defined by the data lines and the scan lines. The data driver transforms a plurality of grayscale data into the data current and applies the data current to the data lines. The scan driver sequentially applies the selection signal to the plurality of scan lines. In this embodiment, the data driver includes a first current generator for generating a plurality of first currents and a plurality of digital/analog (herein referred to as D/A) converters. The D/A converters include a plurality of current sample/hold circuits for respectively sampling/holding the first currents and outputting a plurality of second currents corresponding to the sampled/held first currents in response to at least one of the plurality of grayscale data.

In one embodiment, the data driver further includes a shift register for sequentially delaying a first signal for as much as a first period and generating a plurality of the second signals.

In one embodiment, the plurality of the current sample/hold circuits store a first voltage corresponding to the plurality of the first currents in response to the second signals, and output the plurality of second currents corresponding to the first voltage in response to the at least one of the plurality of grayscale data.

In one embodiment, the plurality of the current sample/hold circuits output the plurality of second currents in response to respective bits of the at least one of the plurality of grayscale data.

In one embodiment, at least one of the current sample/hold circuits includes a transistor, a capacitor, a first switch, and a second switch. In this embodiment, the transistor includes a first electrode, a second electrode coupled to a power source, and a third electrode, and outputs a current corresponding to a voltage applied between the first electrode and the second electrode to the third electrode. The capacitor is coupled between the first and second electrodes of the transistor. The first switch allows the transistor to be diode-connected in response to a respective one of the second signals, and allows a respective one of the first currents to flow through the transistor. The second switch outputs a current flowing through the transistor in response to the at least one of the plurality of grayscale data.

In one embodiment, the number of the first currents generated by the first current generator is the same as the number of bits of the at least one of the plurality of grayscale data. An exemplary display device according to an embodiment of the present invention includes a display unit, a first shift register, a first latch, a grayscale current generator, and an output unit. In this embodiment, the display unit includes a plurality of data lines for transmitting a data current, a plurality of scan lines for transmitting a selection signal, and a plurality of pixel areas defined by the data lines and the scan lines. The first shift register sequentially delays a first signal for as much as a first period and generates a plurality of second signals. The first latch latches a plurality of the grayscale data in synchronization with the second signals and outputs the latched grayscale data. The grayscale current generator receives the plurality of the grayscale data and outputs the data current corresponding to the grayscale data. The output unit applies the data current output by the grayscale current generator to the plurality of the data lines.

In this embodiment, the grayscale current generator includes a bias current generator for generating a plurality of bias currents and a plurality of digital/analog (herein referred to as D/A) converters for using the plurality of the bias currents. The D/A converters include a plurality of current sample/hold circuits for respectively sampling/holding the plurality of the bias currents and output the bias currents in response to each bit of at least one of the plurality of grayscale data.

In one embodiment, the grayscale current generator further includes a second shift register for delaying a third signal for as much as a second period and generates a plurality of fourth signals, and the D/A converters use the bias-currents in synchronization with the fourth signals.

An exemplary display panel according to an embodiment of the present invention includes a display unit, a first current generator, and a plurality of current sample/hold circuits. In this embodiment, the display unit includes a plurality of pixels for displaying an image in response to an applied data current. The first current generator generates a plurality of first currents which are different from each other. Each of the plurality of current sample/hold circuits stores a first voltage corresponding to a respective one of the first currents, and outputs a second current corresponding to the first voltage in response to applied grayscale data.

In one embodiment, the first current generator generates the first currents in response to each bit of the grayscale data.

In one embodiment, the display panel further includes a shift register for delaying sequentially a first signal for as much as a first period and generating a plurality of a second signals. In one embodiment, at least one of the current sample/hold circuits includes a transistor, a capacitor, a first switch, and a second switch. The transistor includes a first electrode, a second electrode coupled to a power source, and a third electrode. The transistor outputs a current corresponding to a voltage applied between the first electrode and the second electrode to the third electrode. The capacitor is coupled between the first electrode and the second electrode of the transistor. The first switch allows the transistor to be diode-connected in response to a respective one of the second signals, and allows a respective one of the first current to flow through the transistor. The second switch outputs a current flowing through the transistor in response to the grayscale data.

In one embodiment, one of the current sample/hold circuit outputs the second current in response to a bit of the grayscale data.

According to an embodiment of the present invention, an exemplary grayscale current generating circuit for converting a digital grayscale data into a grayscale current and outputting the grayscale current includes a first current generator, a plurality of current sample/hold circuits, and a current summing unit. In this embodiment, the first current generator outputs a plurality of first currents which are different from each other. The plurality of current sample/hold circuits respectively sample/hold the first currents and output the sampled/held first currents in response to each bit of the grayscale data. The current summing unit adds up the first currents sampled/held respectively by the plurality of current sample/hold circuits and outputs the added up first currents as the grayscale current.

In one embodiment, the number of the current sample/hold circuits is same as the number of bits of the grayscale data.

In one embodiment, at least one of the current sample/hold circuits includes a transistor, a capacitor, a first switch, and a second switch. The transistor includes a first electrode, a second electrode coupled to a power source, and a third electrode, and outputs a current corresponding to a voltage applied between the first electrode and the second electrode to the third electrode. The capacitor is coupled between the first electrode and the second electrode of the transistor. The first switch allows the transistor to be diode-connected in response to a control signal, and allows a respective one of the first currents to flow through the transistor. The second switch outputs a current flowing through the transistor in response to the grayscale data.

According to an embodiment of the present invention, an exemplary display panel driving method for driving a display panel which includes a plurality of pixel circuits for displaying an image in response to an applied data current. In the method, a plurality of first currents, which are different from each other, are generated. The first currents are sampled, and a plurality of the first voltages corresponding to the first currents are stored respectively. A plurality of the second currents corresponding to the plurality of the first voltages are sampled/held in response to grayscale data. The second currents are added up, and the added up second currents are outputted as the data current.

In one embodiment, during the sampling/holding of the plurality of second currents, the second currents corresponding to the first voltages are output in response to each bit of the grayscale data.

In one embodiment, in the generating of the plurality of first currents, the first currents correspond to each bit of the grayscale data, and the first currents are generated to correspond in number to bits of the grayscale data.

An exemplary display device according to an embodiment of the present invention includes a display unit, a data driver, and a scan driver. In this embodiment, the display unit includes a plurality of data lines for transmitting a data current, a plurality of scan lines for transmitting a selection signal, and a plurality of pixel areas defined by the data lines and the scan lines. The data driver transforms a plurality of grayscale data into the data current and applies the data current to the data lines. The scan driver sequentially applies the selection signal to the plurality of scan lines. In this embodiment, the data driver includes a plurality of digital/analog (herein referred to as D/A) converter groups for receiving a plurality of first currents which are different from each other and outputs the data current corresponding to the grayscale data. The D/A converter group includes a first D/A converter for receiving the first currents and outputting the data current corresponding to the grayscale data, and a second D/A converter for receiving a first voltage corresponding to the first currents and outputting the data current corresponding to the grayscale data.

In one embodiment, the first D/A converter samples/holds the first currents and stores a second voltage corresponding to the first currents, and includes a plurality of first sample/hold circuits for outputting a second current corresponding to the second voltage in response to at least one of the plurality of grayscale data.

In one embodiment, at least one of the first sample/hold circuits includes a first transistor, a first switch, a second switch, a first capacitor, and a third switch. The first transistor includes a first electrode, a second electrode, and a third electrode, and outputs a current corresponding to a voltage applied between the first electrode and the second electrode to the third electrode. The first switch allows the first transistor to be diode-connected in response to a respective one of a plurality of second signals. The second switch transmits a respective one of the first currents to the first transistor in response to the respective one of the second signals. The first capacitor stores the second voltage corresponding to the respective one of the first currents. The third switch outputs at least a part of the second current corresponding to the second voltage in response to the at least one of the plurality of grayscale data.

In one embodiment, the second D/A converter includes a plurality of the second sample/hold circuits for storing a third voltage corresponding to the first currents and outputs a third current corresponding to the third voltage in response to at least another one of the plurality of grayscale data.

In one embodiment, at least one of the second sample/hold circuits includes a second transistor, a second capacitor, and a fourth switch. The second transistor includes a first electrode coupled to the first electrode of the first transistor, a second electrode, and a third electrode, and outputs a current corresponding to a voltage applied between the first electrode and the second electrode to the third electrode. The second capacitor is coupled between the first and second electrodes of the second transistor and stores the third voltage corresponding to the first currents. The fourth switch outputs at least a part of the third current corresponding to the voltage stored in the second capacitor in response to the at least another one of the plurality of grayscale data.

In one embodiment, the number of the first and the second sample/hold circuits are the same and are each also the same as the number of bits of the at least one and another one of the plurality of grayscale data, respectively; and the first and second sample/hold circuits respectively output the second and third currents in response to the bits of the at least one and another one of the plurality of grayscale data.

An exemplary display device according to an embodiment of the present invention includes a display unit, a first shift register, a first latch, a grayscale current generator, and an output unit. The display unit includes a plurality of data lines for transmitting a data current, a plurality of scan lines for transmitting a selection signal, and a plurality of pixel areas defined by the data lines and the scan lines. The first shift register sequentially delays a first signal for as much as a first period and generates a plurality of second signals. The first latch latches a plurality of the grayscale data in synchronization with the second signals and outputs the latched grayscale data. The grayscale current generator receives the plurality of the grayscale data and outputs the data current corresponding to the grayscale data. The output unit applies the data current output by the grayscale current generator to the plurality of the data lines.

In this embodiment, the grayscale current generator includes a bias current generator for generating a plurality of bias currents and a plurality of digital/analog (D/A) converter groups for using the plurality of the bias currents and outputting the data current corresponding to the grayscale data. One of the D/A converter groups includes a first D/A converter for receiving the bias currents and outputting the data current corresponding to the grayscale data, and a second D/A converter for receiving a first voltage corresponding to the bias currents and outputting the data current corresponding to the grayscale data.

In one embodiment, the grayscale current generator further includes a second shift register for delaying a third signal for as much as a second period and generating a plurality of fourth signals, and the first D/A converter uses the bias currents in response to the fourth signals.

In one embodiment, the first D/A converter includes a plurality of the first sample/hold circuits for sampling the bias currents in response to the fourth signals and outputs the sampled bias currents in response to at least one of the plurality of grayscale data. The second D/A converter includes a plurality of the second sample/hold circuits for receiving the first voltage corresponding to the bias currents and outputting a current corresponding to the first voltage in response to at least another one of the plurality of grayscale data.

An exemplary display panel according to an embodiment of the present invention includes a display unit, a first current generator, a plurality of first current sample/hold circuits, and a plurality of second current sample/hold circuits. The display unit includes a plurality of pixels for displaying an image in response to an applied data current. The first current generator generates a plurality of first currents which are different from each other. The plurality of first current sample/hold circuits respectively store a first voltage corresponding to the first currents, and respectively output a second current corresponding to the first voltage in response to a first grayscale data. The plurality of second current sample/hold circuits copy the first currents, store a second voltage corresponding to the first currents, and output a third current corresponding to the second voltage in response to a second grayscale data.

In one embodiment, the display panel further includes a shift register for delaying sequentially a first signal for as much as a first period and generating a plurality of the second signals.

In one embodiment, the first current sample/hold circuits store the first voltage corresponding to the first currents in response to the second signals. According to an embodiment of the present invention, an exemplary grayscale current generating circuit for transforming a digital grayscale data into a grayscale current and outputting the grayscale current includes a first current generator, a plurality of first current sample/hold circuits, and a plurality of second current sample/hold circuits. The first current generator outputs a plurality of first currents which are different from each other. The plurality of first current sample/hold circuits sample/hold the first currents and output a second current corresponding to the sampled/held first currents in response to each bit of a first grayscale data.

The plurality of second current sample/hold circuits copy the first currents and output a third current corresponding to the copied first currents in response to each bit of a second grayscale data.

In one embodiment, the number of the first and second sample/hold circuits are the same as the number of bits of the first and second grayscale data, respectively.

In one embodiment, at least one of the first sample/hold circuit includes a first transistor, a first switch, a second switch, a first capacitor, and a third switch. The first transistor includes a first electrode, a second electrode, and a third electrode, and outputs a current corresponding to a voltage applied between the first electrode and the second electrode to the third electrode. The first switch allows the first transistor to be diode-connected in response to a control signal. The second switch transmits a respective one of the first currents to the first transistor in response to the control signal. The first capacitor stores the first voltage corresponding to the respective one of the first currents. The third switch outputs at least a part of the second current corresponding to the first voltage in response to the first grayscale data.

In one embodiment, at least one of the second sample/hold circuits includes a second transistor, a second capacitor, and a fourth switch. The second transistor includes a first electrode, a second electrode, and a third electrode, and outputs a current corresponding to a voltage applied between the first electrode and the second electrode to the third electrode. The second capacitor is coupled between the first and second electrodes of the second transistor and stores a second voltage corresponding to the first currents. The fourth switch outputs at least a part of the third current corresponding to the second voltage stored in the second capacitor in response to the second grayscale data.

According to an embodiment of the present invention, an exemplary display panel driving method for driving a display panel comprising a plurality of pixel circuits for displaying an image in response to an applied data current. In the method, a) a plurality of first currents which are different from each other are sampled, and a plurality of first voltages corresponding respectively to the first currents are stored; b) the first currents are copied, and a plurality of second voltages corresponding to the first currents are stored respectively; c) a plurality of the second currents corresponding to the first voltages are output in response to a first grayscale data representing a grayscale of a first pixel among the plurality of the pixels; d) a plurality of third currents corresponding respectively to the second voltages are outputted in response to a second grayscale data representing a grayscale of a second pixel among the plurality of the pixels; and e) the second and third currents are respectively applied to the first and second pixels.

In one embodiment, in c), the second currents corresponding to the first voltages are output in response to each bit of the first grayscale data, and in d), the third currents corresponding to the second voltages are output in response to each bit of the second grayscale data.

In one embodiment, the number of the first currents is same as the number of bits of the first grayscale data, and the first currents correspond to each bit of the first grayscale data.

DETAILED DESCRIPTION

Figure 1:
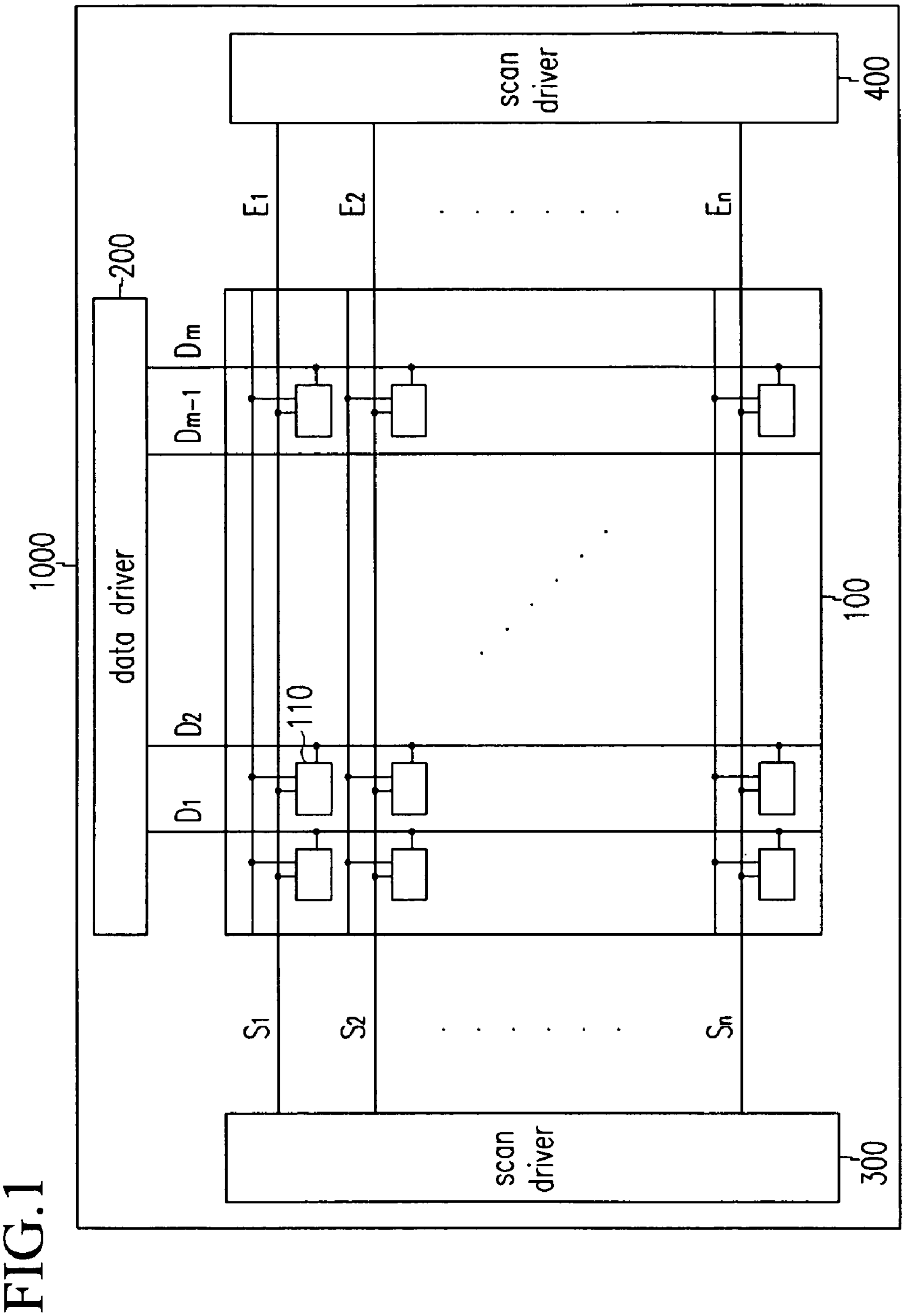
FIG. 1 is a top plan view of an OLED display according to an embodiment of the present invention.

Certain embodiments of the present invention will hereinafter be described in detail with reference to the accompanying drawings.

In the following description, when it is described that an element is coupled to another element, the element may be directly coupled to the other element or coupled to the other element through a third element. Like reference numerals designate like elements throughout the specification. In addition, in exemplary embodiments of the present invention, when it is described that a current is output from a first driver to a second driver, a direction of the current may differ according to a type of the first driver. In more detail, an output current of the first driver flows from the first driver to the second driver when the first driver is a source-type driver, and an output current flows from the second driver to the first driver when the first driver is a sink-type driver.

In the following description according to certain embodiments of the present invention, an organic light emitting diode display (hereinafter, OLED display) using an electro-luminescence of organic material will be exemplified as a display device.

FIG. 1 is a top plan view of an OLED display according to an embodiment of the present invention. As shown in FIG. 1, the OLED display according to an embodiment of the present invention includes a substrate 1000 for forming a display panel. The substrate 1000 includes a display unit 100 on which an actual image is displayed and a peripheral part on which no image is displayed. On the peripheral part, a data driver 200, and scan drivers 300, 400 are formed.

The display unit 100 includes a plurality of data lines $D_1$ to $D_m$, a plurality of scan lines $S_1$ to $S_n$, a plurality of light emission scan lines $E_1$ to $E_n$, and a plurality of pixels 110. The data lines $D_1$ to $D_m$ are extended in a column direction, and are for transmitting a data current for representing an image to a pixel 110. The scan lines $S_1$ to $S_n$ and the light emission scan lines $E_1$ to $E_n$ are extended in a row direction, and respectively are for transmitting a selection signal and a light emission signal to the pixel 110. A pixel area is defined by one data line and one scan line.

The data driver 200 applies the data current (or a plurality of data currents) to the data lines $D_1$ to $D_m$. The scan driver 300 sequentially applies the selection signal (or a plurality of selection signals) to the plurality of scan lines $S_1$ to $S_n$, and the scan driver 400 sequentially applies the light emission control signal (or a plurality of light emission control signals) to the plurality of light emission scan lines $E_1$ to $E_n$.

The data driver 200 and/or the scan drivers 300, 400 may be directly built on the substrate 1000, as a form of an integrated circuit. Alternatively, the drivers 200, 300, and/or 400 may be formed on the same layer of the substrate 1000 in which the data lines $D_1$ to $D_m$, scan lines $S_1$ to $S_n$, light emission scan lines $E_1$ to $E_n$, and transistors of the pixels (or pixel circuits) are formed. Alternatively, the drivers 200, 300, and/or 400 may be formed on another separate substrate rather than the substrate 1000, and the separate substrate may be coupled with the substrate 1000. The drivers 200, 300, and/or 400 may be mounted as a chip on a tape carrier package (TCP), a flexible printed circuit (FPC), or a tape automatic bonding (TAB) attached and electrically coupled to the substrate 1000.

Figure 2:
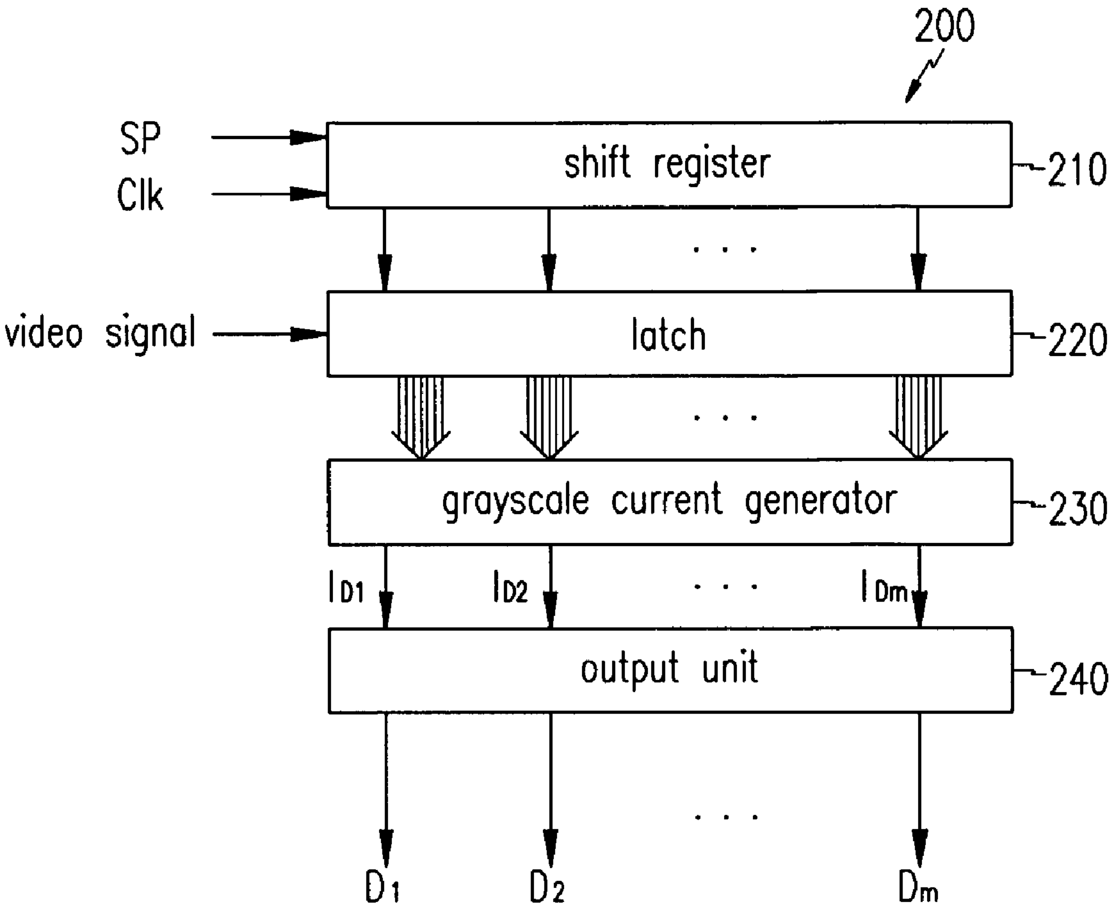
FIG. 2 is a block diagram illustrating a data driver according to an embodiment of the present invention.

FIG. 2 is a block diagram illustrating the data driver 200 according to an embodiment of the present invention.

As shown in FIG. 2, the data driver 200 includes a shift register (or a first shift register) 210, a latch (or a first latch) 220, a grayscale current generator 230, and an output unit 240.

The shift register 210 sequentially shifts a start signal SP in synchronization with a clock signal Clk and outputs the start signal SP as a plurality of shifted start signals. The latch 220 latches a plurality of video signals in synchronization with the output signals of the shift register 210, and outputs the video signals.

The grayscale current generator 230 receives the video signals output from the latch 220, and generates grayscale currents $I_{D1}$ to $I_{Dm}$ corresponding to the video signals.

The output unit 240 applies the grayscale currents $I_{D1}$ to $I_{Dm}$ output form the grayscale current generator 230 to the data lines $D_1$ to $D_m$, respectively. The output unit 240 may be formed as a buffer circuit which is coupled with a terminal of the grayscale current generator 230 and the data lines $D_1$ to $D_m$ and is placed therebetween.

Figure 3:
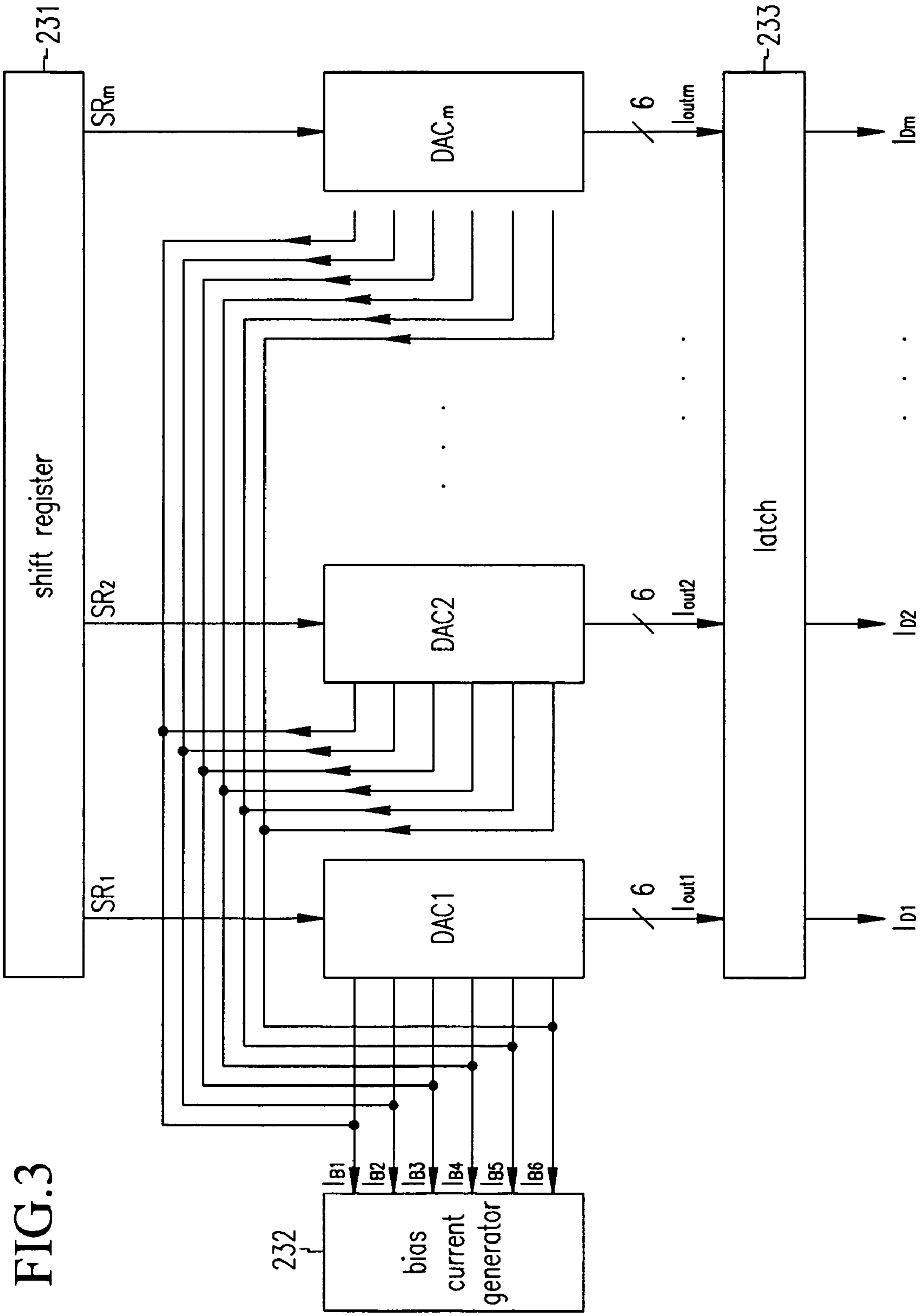
FIG. 3 is a block diagram illustrating a grayscale current generator according to a first embodiment of the present invention.
Figure 4:
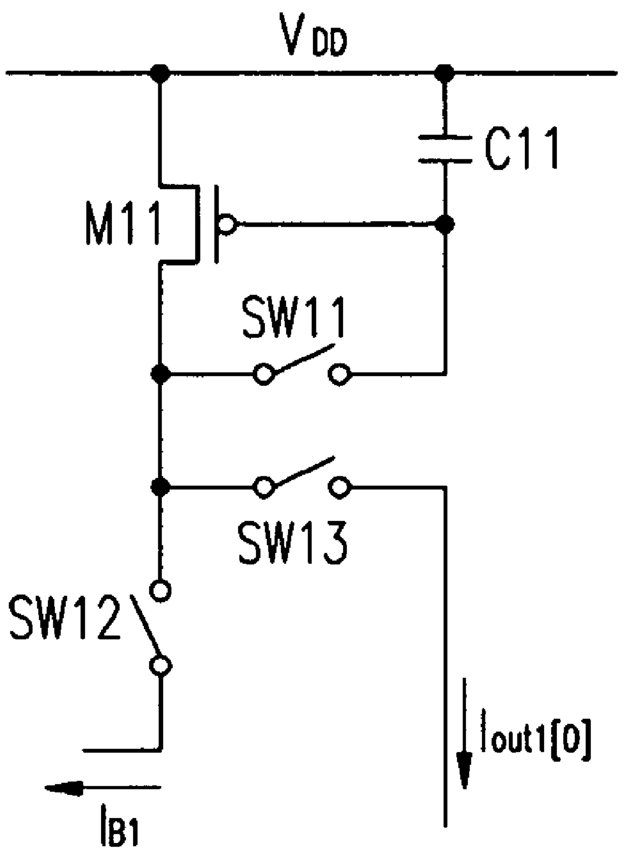
FIG. 4 shows an exemplary current sample/hold circuit used for a digital/analog (D/A) converter shown in FIG. 3.
Figure 5:
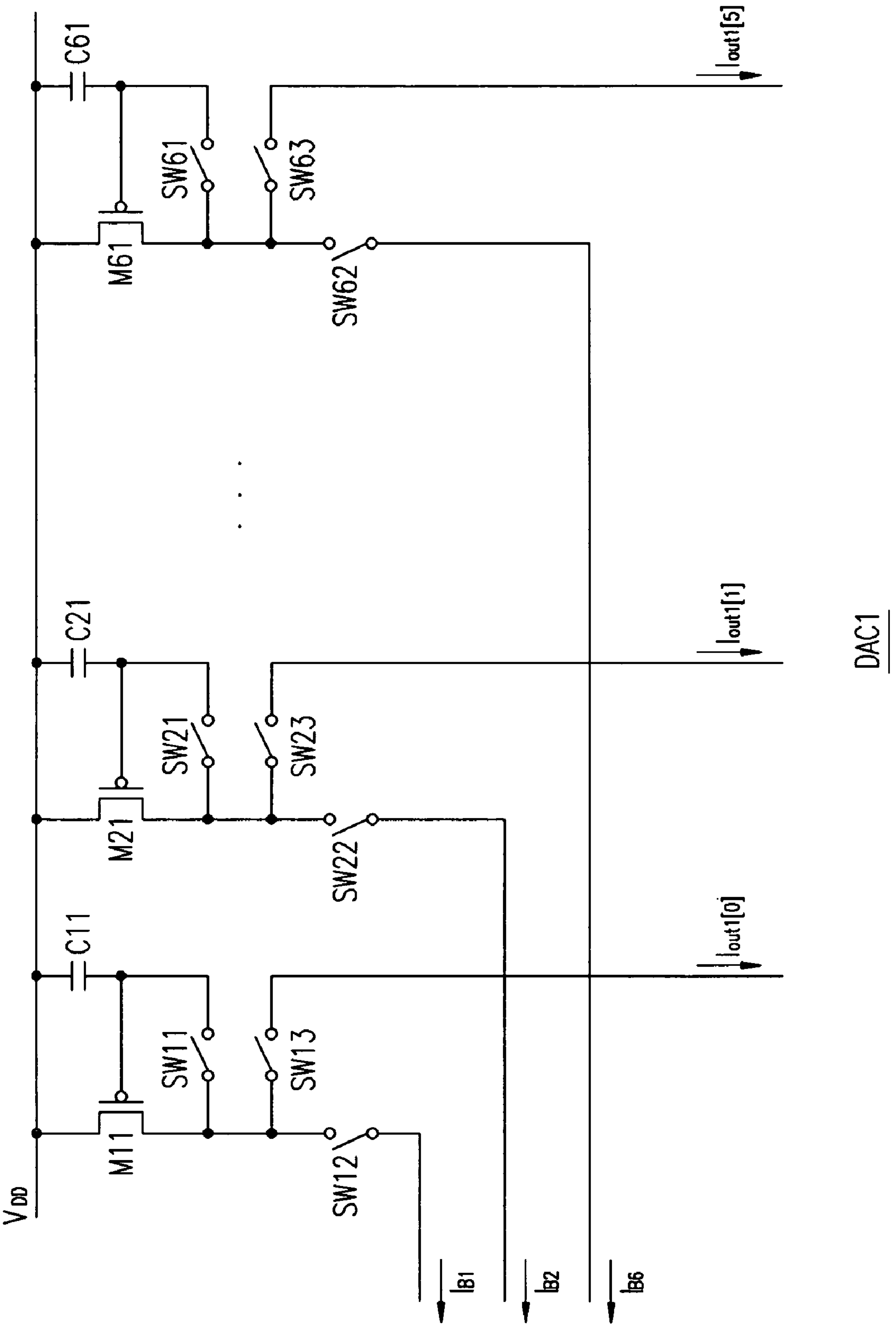
FIG. 5 is a detailed circuit diagram of the D/A converter according to the first embodiment of the present invention.

Referring now to FIGS. 3, 4 and 5, a grayscale current generator according to a first embodiment of the present invention will be described. For better understanding and ease of description, the video signal is assumed to be grayscale data of six (6) bits, but the present invention is not thereby limited.

FIG. 3 is a block diagram illustrating the grayscale current generator (e.g., the grayscale current generator 230) according to a first embodiment of the present invention.

As shown in FIG. 3, the grayscale current generator (e.g., the grayscale current generator 230) according to the first embodiment of the present invention includes a shift register (or a second shift register) 231, a bias current generator 232, D/A converters $DAC_1$ to $DAC_m$, and a latch (or a second latch) 233. In FIG. 3, the bias current generator 232 is illustrated as a sink-type driver.

The shift register 231 sequentially shifts a start signal (not shown) in synchronization with a clock signal (not shown) and outputs a plurality of shifted start signals $SR_1$ to $SR_m$, so that the D/A converters $DAC_1$ to $DAC_m$ may sequentially receive bias currents $I_{B1}$ to $I_{B6}$.

The bias current generator 232 generates the bias currents $I_{B1}$ to $I_{B6}$ corresponding to the number of bits of grayscale data, and outputs them to the D/A converters $DAC_1$ to $DAC_m$. According to an embodiment of the present invention, the bias current $I_{B2}$ is set to be substantially at two (2) times the bias current $I_{B1}$, and the bias currents $I_{B3}$ to $I_{B6}$ are respectively set to be substantially at four (4) times, eight (8) times, 16 times, and 32 times the bias current $I_{B1}$.

The D/A converters $DAC_1$ to $DAC_m$ convert the grayscale data into analog currents $I_{out1}$ to $I_{outm}$ in synchronization with the output signals $SR_1$ to $SR_m$ of the shift register 231. The D/A converters $DAC_1$ to $DAC_m$ include as many current sample/hold circuits as the number of bits of the grayscale data. The 6 current sample/hold circuits included in one D/A converter respectively sample/hold the bias currents $I_{B1}$ to $I_{B6}$, and output the sampled/held currents in response to each bit of the grayscale data.

FIG. 4 is showing a current sample/hold circuit of the $DAC_1$ which samples/holds a current corresponding to a first bit of the grayscale data, according to the first embodiment of the present invention.

As shown in FIG. 4, the current sample/hold circuit includes a transistor M11, a capacitor C11, and switches SW11, SW12, SW13.

The transistor M11 is formed of a MOS transistor of a P-type channel (e.g., a PMOS), and a source of the transistor M11 is coupled to a source voltage VDD. The capacitor C11 is coupled between a gate and the source of the transistor M11.

The switch SW11 is coupled between a drain and the gate of the transistor M11, and is turned on in response to the output signal $SR_1$ of the shift register 231.

The switch SW12 is coupled between an output terminal of the bias current generator 232 and the drain of the transistor M11, and is turned on in response to the output signal $SR_1$ of the shift register 231.

The switch SW13 is coupled between the drain of the transistor M11 and the output terminal of the D/A converter $DAC_1$, and is turned on in response to the first bit of the grayscale data.

Accordingly, when the output signal $SR_1$ is input from the shift register 231, to turn on the switch SW11, the transistor M11 is set to be diode-connected. Then switch SW12 is turned on, and the bias current $I_{B1}$ is transmitted to the transistor M11. Therefore, a voltage corresponding to the bias current $I_{B1}$ is stored in the capacitor C11.

Thereafter, the grayscale data is applied to the switch SW13, and the switch SW13 is turned on when the first bit of the grayscale data is given to be 1. Then, a current corresponding to the voltage stored in the capacitor C11 flows to the output terminal of the D/A converter $DAC_1$ through the transistor M11. When the first bit of the grayscale data is given to be 0, the switch SW13 is turned off, and the current from the transistor M11 is cut off.

This current sample/hold circuit described above is formed as many times as the number of bits of the grayscale data. The first to sixth bits of the grayscale data are applied to a switch (e.g., the switch SW13) of each current sample/hold circuit, so that the grayscale currents $I_{D1}$ to $I_{Dm}$ corresponding to the 6-bit grayscale data may be outputted.

FIG. 5 is a circuit diagram for the D/A converter according to the first embodiment of the present invention, and shows representatively the D/A converter $DAC_1$ among the D/A converters $DAC_1$ to $DAC_m$.

The D/A converter $DAC_1$ includes 6 current sample/hold circuits. Each current sample/hold circuit samples/holds a respective one of the bias currents $I_{B1}$ to $I_{B6}$, and outputs the bias currents $I_{B1}$ to $I_{B6}$ to the output terminal in response to the bits of the grayscale data.

In more detail, when the output signal $SR_1$ is applied from the shift register 231, switches SW11 to SW61 of the 6 current sample/hold circuits are turned on, transistors M11 to M61 are diode-connected, switches SW12 to SW62 are turned on, and the bias currents $I_{B1}$ to $I_{B6}$ flow through the transistors M11 to M61. Therefore, voltages corresponding to the bias currents $I_{B1}$ to $I_{B6}$ are respectively stored in capacitors C11 to C61.

When each bit of grayscale data is applied to the 6 switches SW13 to SW63 of the current sample/hold circuits, each of the 6 current sample/hold circuits outputs a current corresponding to the voltages stored in a respective one of the capacitors C11 to C61 in response to the grayscale data.

For example, when the grayscale data is given to be 001010, the switches SW23, and SW43 of the second and the fourth current sample/hold circuits are turned on, and currents $I_{out1}$[1], and $I_{out1}$[3] corresponding to the voltages stored in the capacitors C21 and C41 are output.

While the output signals $SR_1$ to $SR_m$ from the shift register 231 are sequentially applied to a plurality of the D/A converters $DAC_1$ to $DAC_m$, a plurality of the grayscale data are applied to the corresponding D/A converters $DAC_1$ to $DAC_m$, and the D/A converters $DAC_1$ to $DAC_m$ sequentially output the currents corresponding to the grayscale data in synchronization with the output signals $SR_1$ to $SR_m$ of the shift register.

In the D/A converter according $DAC_1$ to an embodiment of the present invention, the bias current generator 232 generates the 6 bias currents $I_{B1}$ to $I_{B6}$ corresponding to each bit of the grayscale data, and outputs the 6 bias currents $I_{B1}$ to $I_{B6}$ to the 6 current sample/hold circuits. Therefore, a deviation of a the holding current due to the characteristics of the transistors M11 to M61 can be less than a comparison example for inputting one bias voltage or bias current and holding a plurality of currents which are different from each other.

That is, in the comparison example, by using one bias voltage or one bias current and controlling channel widths and channel lengths of six transistors included in the current sample/hold circuits, the respective current sample/hold circuits may sample and/or hold different currents. However, in the comparison example, a desired current may not be held due to the deviations of the six transistors.

Therefore, according to an embodiment of the present invention, characteristics of transistors M11 to M61 included in the current sample/hold circuits are set to be substantially the same. The bias current generator 232 generates a plurality of bias currents and transmits the plurality of bias currents to the current sample/hold circuits, so that the difference in the currents due to the deviations of the transistors M11 to M61 can be prevented and/or compensated.

However, in the grayscale current generator according to the first embodiment of the present invention, a sampling interval for each of the D/A converters $DAC_1$ to $DAC_m$ may be excessively short because the bias current generator 232 needs to generate the bias currents $I_{B1}$ to $I_{B6}$ and to sequentially apply the bias currents to D/A converters $DAC_1$ to $DAC_m$. In more detail, while the selection signals are sequentially applied to the scan lines $S_1$ to $S_n$, the output unit (or latch) 233 needs to apply data currents to the data lines $D_1$ to $D_m$. So, during a horizontal period, all the D/A converters $DAC_1$ to $DAC_m$ have to sample/hold the bias currents $I_{B1}$ to $I_{B6}$, and output grayscale currents corresponding to the grayscale data to the output unit 233.

Therefore, there occurs a possibility that a current sample/hold circuit included in the D/A converter would hold a current even when the current sample/hold circuit has not sufficiently charged the voltage corresponding to a respective one of the bias currents $I_{B1}$ to $I_{B6}$ in a pre-allocated interval.

In an enhancement of the first embodiment, a grayscale current generator (e.g., grayscale current generator 230) according to a second embodiment of the present invention divides the D/A converters $DAC_1$ to $DAC_m$ into a plurality of groups, and D/A converters belonging to a certain group are controlled to perform a sampling/holding in substantially simultaneous time, so that a time for sampling may be assured.

Hereinafter, referring to FIG. 6 to FIG. 8, the grayscale current generator (e.g., the grayscale current generator 230) according to the second embodiment of the present invention will be described.

Figure 6:
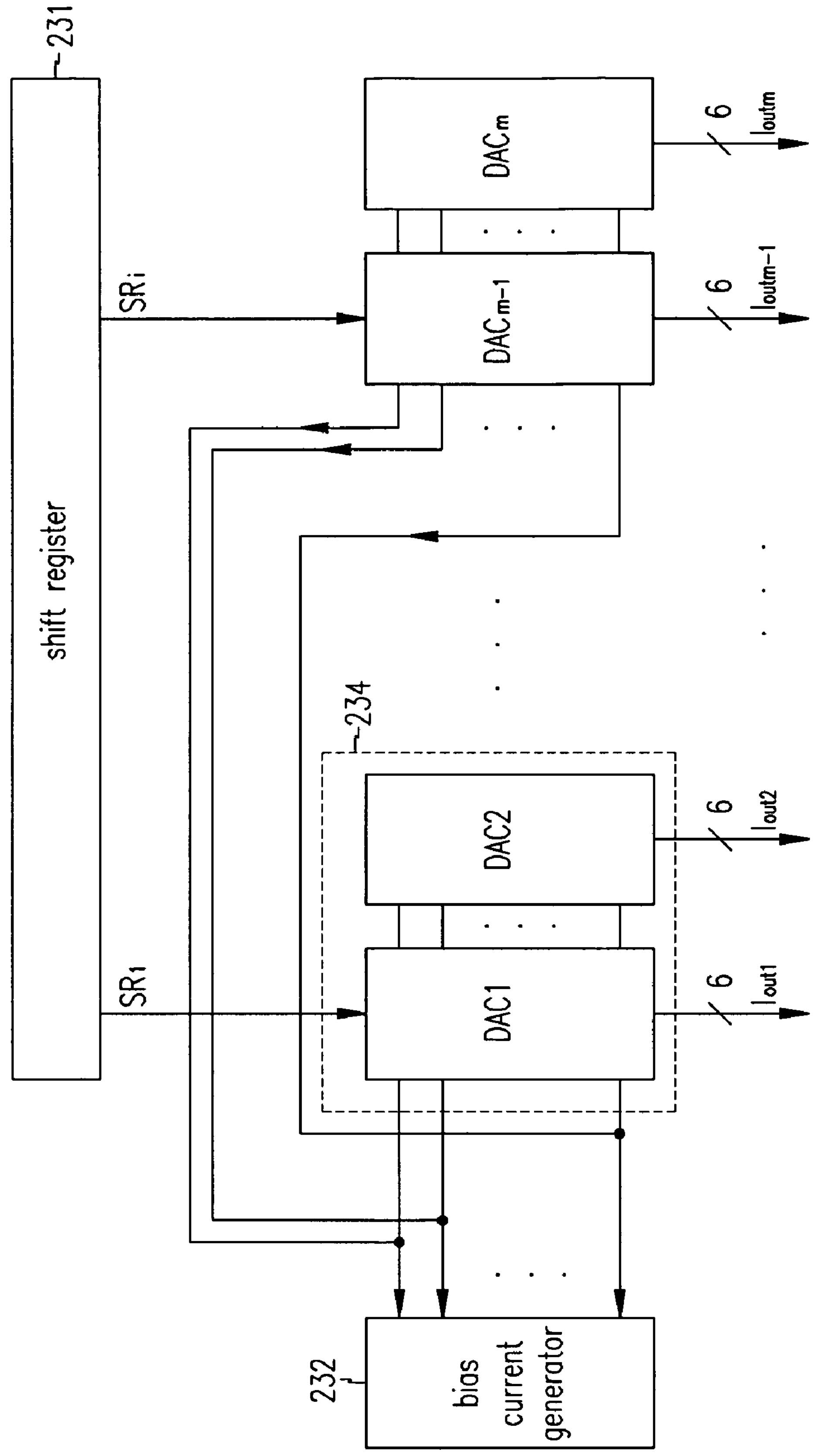
FIG. 6 is a block diagram illustrating a grayscale current generator according to a second embodiment of the present invention.

FIG. 6 is a block diagram illustrating the grayscale current generator according to the second embodiment of the present invention.

As shown in FIG. 6, the grayscale current generator (e.g., the grayscale current generator 230) according to the second embodiment of the present invention is different from the grayscale current generator according to the first embodiment of the present invention in that the second embodiment divides a plurality of the D/A converters $DAC_1$ to $DAC_m$ into at least two groups to transmit the bias currents.

The output signals $SR_1$ to $SR_i$ of the shift register 231 are applied to one of a plurality of D/A converters included in each group, and the bias current $I_{B1}$ to $I_{B6}$ are transmitted to the D/A converter to which the output signal of shift register 231 is applied.

In more detail, as shown in FIG. 6, when two D/A converters (e.g., $DAC_1$ and $DAC_2$) are set to be one group 234, the output signals $SR_1$ to $SR_i$ of the shift register 231 may be applied to the first D/A converter $DAC_{2i-1}$ (e.g., $DAC_1$ or $DAC_{m-1}$) included in each group, the D/A converter $DAC_{2i-1}$ receives the bias currents $I_{B1}$ to $I_{B6}$, and the D/A converter $DAC_{2i}$ (e.g., $DAC_2$ or $DAC_m$) receives the voltage corresponding to the bias currents $I_{B1}$ to $I_{B6}$.

Accordingly, an enable period of the output signals of the shift register 231 according to the second embodiment of the present invention can effectively increase to become substantially two times that of the output signals of the shift register 231 according to the first embodiment of the present invention. Also, sampling period for the bias currents $I_{B1}$ to $I_{B6}$ of the D/A converter $DAC_1$ to $DAC_m$ of the second embodiment can effectively increase to become substantially two times the sampling period of the first embodiment.

Hereinafter, a configuration and an operation of the D/A converter of the grayscale current generator according to the second embodiment of the present invention will be described in more detail. For better understanding and ease, it is assumed that one D/A group includes two D/A converters, and the D/A converters $DAC_1$ and $DAC_2$ included in a first group will be described mainly as an example among a plurality of the D/A groups.

According to the second embodiment of the present invention, the D/A converter $DAC_1$ includes 6 current sample/hold circuits; one current sample/hold circuit is formed substantially equivalently as the current sample/hold circuit in FIG. 4.

In other words, the current sample/hold circuit of the D/A converter $DAC_1$ includes a transistor M11, a capacitor C11, and switches SW11, SW12, SW13. The switches SW11 and SW12 are turned on in response to the output signal $SR_1$ of the shift register 231, the capacitor C11 stores a voltage corresponding to the bias current flowing through the transistor M11. The switch SW13 is turned on in response to the grayscale data, and then a current corresponding to the voltage stored in the capacitor C11 is output to the output terminal of the D/A converter $DAC_1$.

The D/A converter $DAC_2$ includes 6 current sample/hold circuits; each current sample/hold circuit copies the bias current flowing in the current sample/hold circuit of the D/A converter $DAC_1$, and stores a voltage corresponding to bias current.

Figure 7:
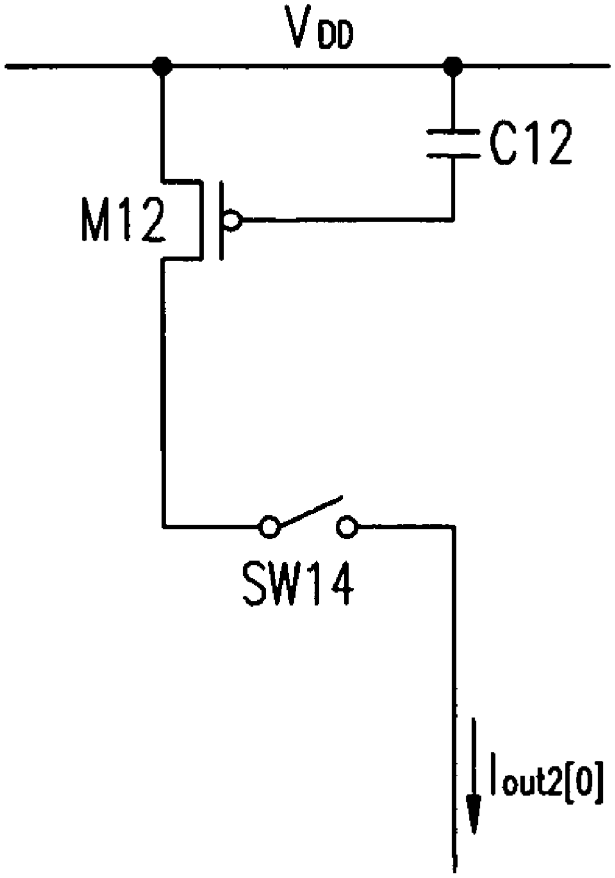
FIG. 7 shows an exemplary current sample/hold circuit used for a D/A converter shown in FIG. 6.

FIG. 7 is a circuit diagram showing the current sample/hold circuit of the D/A converter $DAC_2$ according to the second embodiment of the present invention, and in more detail, illustrates the current sample/hold circuit holding a current corresponding to the first bit of the grayscale data.

As shown in FIG. 7, the current sample/hold circuit of the D/A converter $DAC_2$ includes a transistor M12, a capacitor C12, and switch SW14.

A gate of the transistor M12 is coupled to the gate of the transistor M11 (not shown). A source of the transistor M12 is coupled to the power source VDD. The capacitor C12 is coupled between the gate and a source of the transistor M12, and stores a voltage corresponding to a current flowing through the transistor M12.

The switch SW14 is coupled to a drain of the transistor M12, and is turned on in response to the first bit of the grayscale data.

According to this configuration, a voltage, which is substantially equivalent to the voltage applied to the gate of the voltage transistor M1, is applied to the gate of transistor M12, and a current, which is substantially equivalent to the bias current $I_{B1}$ flowing through the transistor M11, may flow through the transistor M12.

Therefore, the voltage corresponding to the current flowing through the transistor M12 is charged in the capacitor C12. In addition, when the switch SW14 is turned on in response to the first bit of the grayscale data, a current corresponding to the voltage stored in the capacitor C12 is output through the switch SW14.

As described above, when the current sample/hold circuit included in the D/A converter $DAC_2$ is coupled with the current sample/hold circuit included in the D/A converter $DAC_1$, the D/A converters $DAC_1$, $DAC_2$ perform substantially simultaneously sampling/holding the bias current.

In other words, a plurality of current sample/hold circuits included in one group perform substantially simultaneously sampling/holding, and output the sampled/held current in response to the applied grayscale data. Here, the grayscale data may be sequentially or simultaneously applied to the two D/A converters $DAC_1$ and $DAC_2$.

Figure 8:
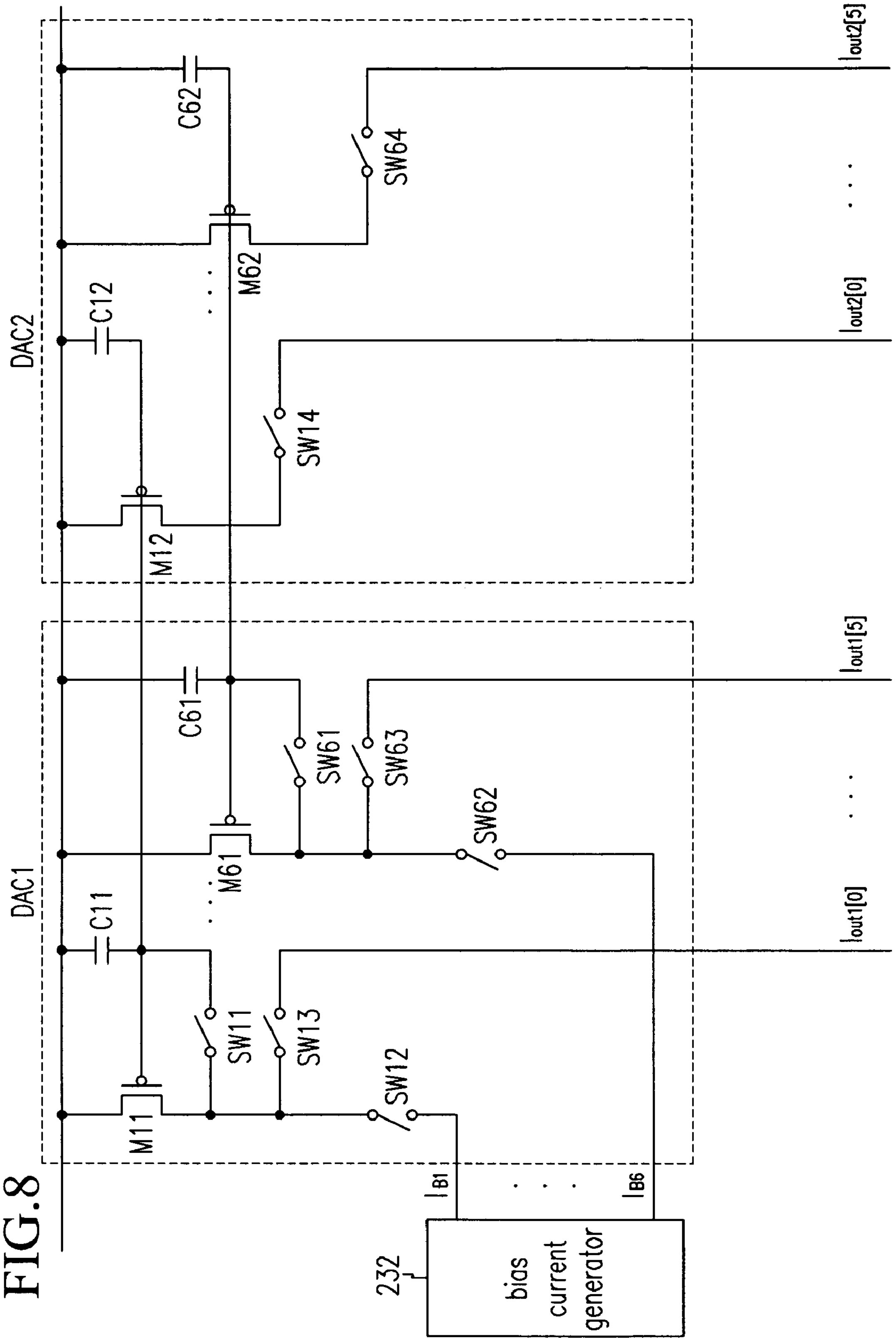
FIG. 8 is a circuit diagram illustrating a D/A converter group according to the second embodiment of the present invention.

FIG. 8 is a circuit diagram illustrating the D/A converters $DAC_1$ and $DAC_2$ included in a D/A converter group (e.g., the D/A converter group 234) according to the second embodiment of the present invention.

As shown in FIG. 8, the bias currents $I_{B1}$ to $I_{B6}$ are respectively applied to the current sample/hold circuits of the D/A converter $DAC_1$, and gates of transistors M12 to M62 of the D/A converter $DAC_2$ are coupled to gates of transistors M11 to M61 of the D/A converter $DAC_1$, respectively.

Accordingly, a plurality of D/A converters $DAC_{2i-1}$ and $DAC_{2i}$ included in one group substantially simultaneously sample the bias currents $I_{B1}$ to $I_{B6}$, so that sampling time of the current sample/hold circuit may be increased. In addition, the bias current generator 232 sequentially transmits the bias current to each group, so that a deviation of bias currents transmitted to the D/A converters $DAC_1$ to $DAC_m$ may be reduced.

In other words, if the bias currents are transmitted to one D/A converter $DAC_1$ while voltages corresponding to the bias currents are transmitted to the other D/A converters $DAC_2$ to $DAC_m$, the deviation of the bias currents transmitted to the D/A converters $DAC_1$ to $DAC_m$ may be increased due to the characteristic deviation of transistors included in the current sample/hold circuits.

Therefore, when the number of D/A converters included in one group is appropriately controlled, the sampling time of the current sample/hold circuit may be assured, and the deviation of the bias currents transmitted to the D/A converters may be reduced.

In view of the foregoing, a grayscale current generating circuit and an organic light emitting diode (OLED) display using the same, and a display panel and a driving method thereof have been described. The embodiments described above are exemplary embodiments which reflect a concept of the present invention. However, it should be understood that the present invention is not limited thereto, since various modification and/or variations may be readily understood by a person skilled in the art to be within the spirit and scope of the present invention.

For example, the circuits described in FIG. 4 and FIG. 7 are used for a current sample/hold circuit included in the D/A converter. However, the scope of the present invention is not limited to a specified current sample/hold circuit. Various current sample/hold circuits can be applied, which can sample the bias current in synchronization with the output signal of the shift register and output the sampled current in response to the grayscale data, or which can copy a current flowing in the current sample/hold circuit and output copied current in response to the grayscale data.

In addition, in FIG. 4 to FIG. 8, it is described that the transistors of the current sample/hold circuit are P-type channel transistors (e.g., PMOS transistors), but a MOS transistor having an N-type channel (e.g., NMOS transistors) may be used, depending on the embodiments. Moreover, other types of active element which include three electrodes and transmit a current corresponding to a voltage applied between two electrodes to another electrode may be also used.

According to an embodiment of the present invention, a grayscale current generating circuit for outputting a grayscale current corresponding to a grayscale data and a display device using the same and a display panel and a driving method thereof may be provided.

By generating a plurality of the bias currents and applying them to a plurality of the current sample/hold circuits, a deviation of the holding currents due to a deviation of transistors used in the current sample/hold circuit may be reduced.

Furthermore, by dividing a plurality of the D/A converters into a plurality of groups and controlling the D/A converters included in one group to sample substantially simultaneously a bias current, sampling time of a current sample/hold circuit included in the D/A converters may be assured.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A display device comprising:

a display unit comprising a plurality of data lines for transmitting data currents, a plurality of scan lines for transmitting selection signals, and a plurality of pixel areas defined by the data lines and the scan lines;

a data driver for transforming a plurality of grayscale data into the data currents and applying the data currents to respective ones of the data lines; and a scan driver for sequentially applying the selection signals to respective ones of the plurality of scan lines, wherein the data driver comprises:

a plurality of digital/analog (D/A) converter groups for receiving a plurality of first currents, the first currents being different from each other, the plurality of D/A converter groups being for outputting a plurality of second currents corresponding to the grayscale data and different ones of the plurality of D/A converter groups receiving the first currents at different times in a sequential manner, wherein a D/A converter group of the plurality of D/A converter groups comprises a first D/A converter comprising a plurality of first sample/hold circuits for receiving the first currents, storing a plurality of first voltages corresponding to the first currents, and outputting a first set of the second currents corresponding to first respective bits of the grayscale data, and a second D/A converter comprising a plurality of second sample/hold circuits for storing a plurality of second voltages corresponding to respective ones of the first voltages and outputting a second set of the second currents corresponding to second respective bits of the grayscale data, wherein each of the plurality of first sample/hold circuits comprises:

a first transistor having a gate electrode; and a first capacitor coupled to the gate electrode of the first transistor, wherein each of the plurality of second sample/hold circuits comprises:

a second transistor having a gate electrode; and a second capacitor coupled to the gate electrode of the second transistor, wherein the gate electrode of the first transistor is directly connected to the gate electrode of the second transistor, wherein the gate electrode of the first transistor of one of the plurality of first sample/hold circuits is controlled separately from the gate electrode of the first transistor of another one of the first sample/hold circuits, wherein the gate electrode of the second transistor of one of the plurality of second sample/hold circuits is controlled separately from the gate electrode of the second transistor of another one of the second sample/hold circuits, and wherein the first voltages and the second voltages are concurrently stored in the first sample/hold circuits and the second sample/hold circuits.

2. The display device of claim 1, wherein the data driver further comprises a shift register for delaying sequentially a first signal for as much as a first period and generating a plurality of second signals.

3. The display device of claim 2, wherein the first transistor comprises a first electrode, a second electrode, and a third electrode, and is for outputting a current corresponding to a voltage applied between the first electrode and the second electrode to the third electrode, and wherein each of the first sample/hold circuits further comprises:

a first switch adapted to diode-connect the first transistor in response to a respective one of the second signals, a second switch for transmitting a respective one of the first currents to the first transistor in response to the respective one of the second signals; and a third switch for outputting at least a part of a respective one of the first set of the second currents corresponding to the first voltage of the first voltages in response to a respective one of the first respective bits of the grayscale data.

4. The display device of claim 3, the second transistor comprises a first electrode, a second electrode, and a third electrode, the first electrode of the second transistor coupled to the first electrode of the first transistor, and wherein a current corresponding to a voltage applied between the first electrode of the second transistor and the second electrode of the second transistor is output to the third electrode of the second transistor, and wherein the second capacitor is coupled between the first and the second electrodes of the second transistor and is for storing a second voltage of the second voltages corresponding to the first currents; and wherein each of the second sample/hold circuits further comprises a fourth switch for outputting at least a part of a respective one of the second set of the second currents corresponding to the second voltage of the second voltages stored in the second capacitor in response to a respective one of the second respective bits of the grayscale data.

5. The display device of claim 3, wherein the first sample/hold circuits are the same in number as the first respective bits of the grayscale data, the second sample/hold circuits are the same in number as the second respective bits of the grayscale data, and the first and second sample/hold circuits are respectively configured to output the first and second set of the second currents in response to the respective ones of the first and second respective bits of the grayscale data.

6. A display device comprising:

a display unit comprising a plurality of data lines for transmitting data currents, a plurality of scan lines for transmitting selection signals, and a plurality of pixel areas defined by the data lines and the scan lines;

a first shift register for sequentially delaying a first signal for as much as a first period and generating a plurality of second signals;

a first latch for latching a plurality of grayscale data in synchronization with the second signals and outputting the latched grayscale data;

a grayscale current generator for receiving the grayscale data and outputting the data currents corresponding to the grayscale data; and an output unit for applying the data currents output by the grayscale current generator to the plurality of data lines, wherein the grayscale current generator comprises a bias current generator for generating a plurality of bias currents and a plurality of digital/analog (D/A) converter groups for sequentially utilizing the plurality of bias currents and outputting the data currents corresponding to the grayscale data, different ones of the plurality of D/A converter groups being configured to receive the plurality of bias currents at different times in a sequential manner, wherein a D/A converter group of the D/A converter groups comprises a first D/A converter comprising a plurality of first sample/hold circuits for receiving the bias currents, storing a plurality of first voltages corresponding to the bias currents, and outputting a first set of the data currents corresponding to first respective bits of the grayscale data, and a second D/A converter comprising a plurality of second sample/hold circuits for storing a plurality of second voltages corresponding to respective ones of the first voltages and outputting a second set of the data currents corresponding to second respective bits of the grayscale data, wherein each of the plurality of first sample/hold circuits comprises:

a first transistor having a gate electrode; and a first capacitor coupled to the gate electrode of the first transistor, wherein each of the plurality of second sample/hold circuits comprises:

a second transistor having a gate electrode; and a second capacitor coupled to the gate electrode of the second transistor, wherein the gate electrode of the first transistor is directly connected to the gate electrode of the second transistor, wherein the gate electrode of the first transistor of one of the plurality of first sample/hold circuits is controlled separately from the gate electrode of the first transistor of another one of the first sample/hold circuits, wherein the gate electrode of the second transistor of one of the plurality of second sample/hold circuits is controlled separately from the gate electrode of the second transistor of another one of the second sample/hold circuits, and wherein the first voltages and the second voltages are concurrently stored in the first sample/hold circuits and the second sample/hold circuits.

7. The display device of claim 6, wherein the grayscale current generator further comprises a second shift register for delaying a third signal for as much as a second period and generating a plurality of fourth signals, and the first D/A converter uses the bias currents in response to the fourth signals.

8. A display panel comprising:

a display unit comprising a plurality of pixels for displaying an image in response to an applied data current;

a first current generator for generating a plurality of first currents, the first currents being different from each other;

a plurality of first current sample/hold circuits for respectively storing first voltages corresponding to respective ones of the first currents, and outputting second currents corresponding to respective ones of the first voltages in response to a first grayscale data; and a plurality of second current sample/hold circuits for storing second voltages corresponding to respective ones of the first voltages, and outputting third currents corresponding to respective ones of the second voltages in response to a second grayscale data, wherein each of the plurality of first current sample/hold circuits comprises:

a first transistor having a gate electrode; and a first capacitor coupled to the gate electrode of the first transistor, wherein each of the plurality of second current sample/hold circuits comprises:

a second transistor having a gate electrode; and a second capacitor coupled to the gate electrode of the second transistor, wherein the gate electrode of the first transistor is directly connected to the gate electrode of the second transistor, wherein the gate electrode of the first transistor of one of the plurality of first current sample/hold circuits is controlled separately from the gate electrode of the first transistor of another one of the first current sample/hold circuits, wherein the gate electrode of the second transistor of one of the plurality of second current sample/hold circuits is controlled separately from the gate electrode of the second transistor of another one of the second current sample/hold circuits, wherein the first current generator is configured to supply the plurality of first currents to different ones of the plurality of first current sample/hold circuits at different times in a sequential manner, and wherein the first voltages and the second voltages are concurrently stored in the first current sample/hold circuits and the second current sample/hold circuits.

9. The display panel of claim 8, wherein the display panel further comprises a shift register for delaying sequentially a first signal for as much as a first period and generating a plurality of second signals.

10. The display panel of claim 9, wherein the first current sample/hold circuits are configured to, store the first voltages corresponding to the first currents in response to the second signals.

11. A grayscale current generating circuit for transforming a plurality of digital grayscale data comprising first and second grayscale data into first and second grayscale currents and outputting the first and second grayscale currents comprising:

a first current generator for outputting a plurality of first currents, the first currents being different from each other;

a plurality of first current sample/hold circuits for respectively sampling/holding the first currents and outputting second currents corresponding to respective ones of the sampled/held first currents in response to each bit of the first grayscale data; and a plurality of second current sample/hold circuits for storing voltages corresponding to the first currents concurrently with the sampling/holding of respective ones of the first current sample/hold circuits, and outputting third currents corresponding to respective ones of the stored voltages in response to each bit of the second grayscale data, wherein each of the plurality of first current sample/hold circuits comprises:

a first transistor having a gate electrode; and a first capacitor coupled to the gate electrode of the first transistor, wherein each of the plurality of second current sample/hold circuits comprises:

a second transistor having a gate electrode; and a second capacitor coupled to the gate electrode of the second transistor, wherein the gate electrode of the first transistor is directly connected to the gate electrode of the second transistor, wherein the gate electrode of the first transistor of one of the plurality of first current sample/hold circuits is controlled separately from the gate electrode of the first transistor of another one of the first current sample/hold circuits, and wherein the gate electrode of the second transistor of one of the plurality of second current sample/hold circuits is controlled separately from the gate electrode of the second transistor of another one of the second current sample/hold circuits, and wherein the first current generator is configured to supply the plurality of first currents to different ones of the plurality of first current sample/hold circuits at different times in a sequential manner.

12. The grayscale current generating circuit of claim 11, wherein the first and second current sample/hold circuits are the same in number as bits of the first and second grayscale data, respectively.

13. The grayscale current generating circuit of claim 12, wherein the first transistor comprises a first electrode, a second electrode, and a third electrode, and is for outputting a current corresponding to a voltage applied between the first electrode and the second electrode to the third electrode, and wherein each of the first current sample/hold circuits further comprises:

a first switch adapted to diode-connect the first transistor in response to a control signal;

a second switch for transmitting a respective one of the first currents to the first transistor in response to the control signal; and a third switch for outputting a respective one of the second currents corresponding to the first voltage in response to the first grayscale data.

14. The grayscale current generating circuit of claim 13, wherein the second transistor comprising a first electrode, a second electrode, and a third electrode, the first electrode of the second transistor coupled to the first electrode of the first transistor, the second transistor configured to output a current corresponding to a voltage applied between the first electrode of the second transistor and the second electrode of the second transistor to the third electrode of the second transistor, and wherein the second capacitor is coupled between the first and second electrodes of the second transistor and is for storing a respective one of the voltages corresponding to the first currents in response to the sampling/holding of the respective ones of the first current sample/hold circuits; and wherein at least one of the second current sample/hold circuits comprises a fourth switch for outputting a respective one of the third currents corresponding to the respective one of the voltages stored in the second capacitor in response to the second grayscale data.

15. A display panel driving method, for driving a display panel comprising a plurality of pixels for displaying an image in response to applied data currents, comprising:

a) sampling a plurality of first currents, the first currents being different from each other, and storing a plurality of first voltages respectively corresponding to the first currents in a plurality of first current sample/hold circuits, wherein different ones of the plurality of first current sample/hold circuits sample the plurality of first currents at different times in a sequential manner and wherein a gate electrode of one transistor of one of the first current sample/hold circuits configured to sample one of the first currents is controlled separately from a gate electrode of another transistor of another of the first current sample/hold circuits configured to sample another of the first currents and wherein a first capacitor of the one of the first current sample/hold circuits is coupled to the gate electrode and is configured to store a corresponding one of the first voltages;

b) outputting the plurality of first voltages, from the plurality of first current sample/hold circuits directly to a plurality of second current sample/hold circuits;

c) storing the plurality of first voltages at the plurality of second current sample/hold circuits as a plurality of second voltages respectively corresponding to the first voltages, wherein a gate electrode of one transistor of one of the second current sample/hold circuits configured to receive one voltage of the first voltages is controlled separately from a gate electrode of another transistor of another of the second current sample/hold circuits configured to receive another voltage of the first voltages wherein a second capacitor of the one of the second current sample/hold circuits is coupled to the gate electrode and is configured to store a corresponding one of the second voltages, and wherein the plurality of first voltages and the plurality of second voltages are concurrently stored the first current sample/hold circuits and the second current sample/hold circuits;

d) outputting a plurality of second currents respectively corresponding to the first voltages in response to a first grayscale data representing a gray level of a first pixel among the plurality of the pixels;

e) outputting a plurality of third currents respectively corresponding to the second voltages in response to a second grayscale data representing a gray level of a second pixel among the plurality of the pixels; and f) applying the second and third currents respectively to the first and second pixels.

16. The driving method of claim 15, wherein in c), the second currents corresponding to the first voltages are output in response to each bit of the first grayscale data, and in d), the third currents corresponding to the second voltages are output in response to each bit of the second grayscale data.

17. The driving method of claim 16, wherein the first currents are the same in number as bits of the first grayscale data, and the first currents correspond to each bit of the first grayscale data.

* * * * *

UNITED STATES PATENT AND TRADEMARK OFFICE

CERTIFICATE OF CORRECTION

PATENT NO. : 8,294,648 B2
APPLICATION NO. : 11/228706
DATED : October 23, 2012
INVENTOR(S) : Oh-Kyong Kwon et al.

It is certified that error appears in the above-identified patent and that said Letters Patent is hereby corrected as shown below:

<u>In the Claims</u>

| | |
|---|---|
| Column 17, Claim 10, line 54 | Delete “to,”<br>Insert -- to -- |

Signed and Sealed this
Tenth Day of June, 2014

Michelle K. Lee

*Deputy Director of the United States Patent and Trademark Office*

UNITED STATES PATENT AND TRADEMARK OFFICE

CERTIFICATE OF CORRECTION

PATENT NO. : 8,294,648 B2
APPLICATION NO. : 11/228706
DATED : October 23, 2012
INVENTOR(S) : Kwon It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1169 days.

Signed and Sealed this
Eleventh Day of November, 2014

Michelle K. Lee
*Deputy Director of the United States Patent and Trademark Office*